Nov. 24, 1970 M. W. EGERTON, JR 3,543,173

CLASS B POWER AMPLIFIER

Filed Jan. 21, 1969

INVENTOR

McKENNY W. EGERTON, JR.

BY Le Blanc & Shur

ATTORNEYS

3,543,173
CLASS B POWER AMPLIFIER

McKenney W. Egerton, Jr., Owings Mill, Md., assignor, by mesne assignments, to The Bendix Corporation, a corporation of Delaware Filed Jan. 21, 1969, Ser. No. 792,516
Int. Cl. H03f 3/18, 3/26
U.S. Cl. 330—13 7 Claims

ABSTRACT OF THE DISCLOSURE

Disclosed is a Class B transistor amplifier and phonograph amplifier incorporating it as a power stage. The transistor amplifier comprises an emitter-follower for supplying signals to a load during negative excursions of an input signal and a second complementary common collector transistor for supplying signals to the load during positive excursions of the input signal. A novel bias circuit including a third transistor and a resistor maintains the emitter-follower in light conduction during positive input signal excursions to eliminate crossover distortion. The bias circuit provides good efficiency and good thermal stability.

Figure 1:
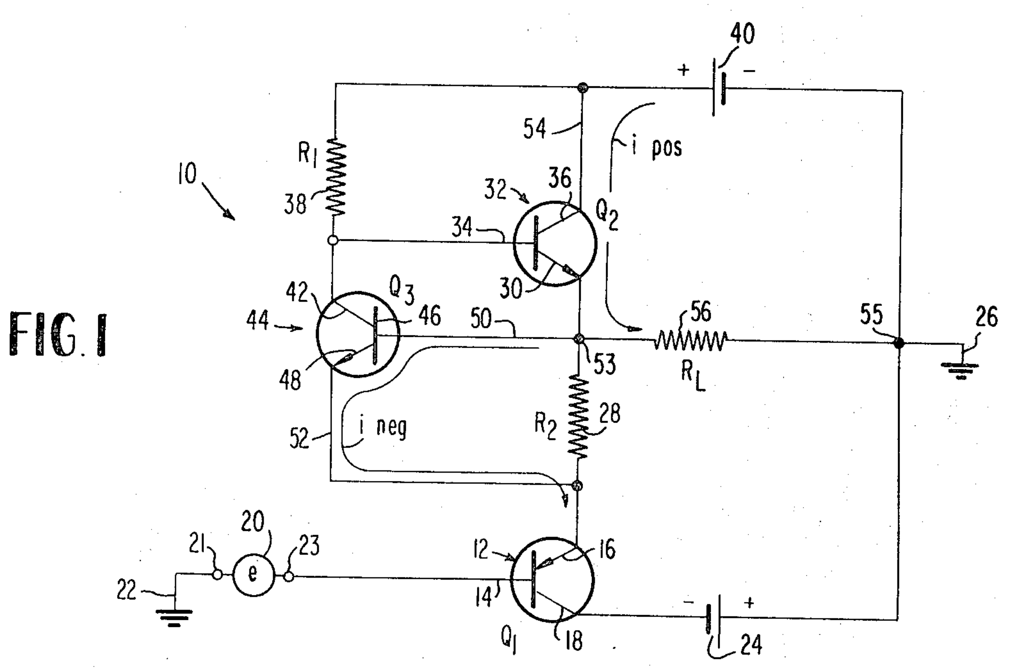

This invention relates to a novel Class B power amplifier and more particularly to a transistor amplifier suitable for use as a Class B output stage for audio and similar circuits.

Class B transistor power amplifiers of conventional construction require a difficult and generally unsatisfactory compromise between crossover distortion, efficiency, and thermal stability. The difficulty arises from the fact that approximately 0.6 volt is required to overcome contact potential in the base-emitter diode of a silicon transistor. That is, the input voltage across the base-emitter electrodes of the silicon transistor must exceed approximately 0.6 volt before the transistor conducts collector current. This results in a flat spot on the transistor transfer characteristic which adversely affects the amplifier output for Class B operation. The region over which there is zero transmission through the transistor amplifier may be reduced but not eliminated by negative feedback, and the great sensitivity of the human ear to this form of distortion renders feedback techniques useless for audio amplifiers of even very modest quality.

Various circuits have been provided, including voltage divider circuits, for developing the necessary 0.6 volt potential to bias the transistor slightly into conduction. These are often used with a complementary common collector audio output stage including a pair of transistors and, if the voltage divider is carefully adjusted to accommodate the transistor characteristics, crossover distortion is very small. Unfortunately, however, the exact voltage required is extremely critical and varies with temperature (about 2 millivolts per degree centigrade). Furthermore, this temperature sensitivity is of a sign or polarity that causes transistor conduction to increase with rising temperature. Since an increase in current results in a further temperature rise, the circuit is susceptible to a type of failure referred to as thermal runaway, which destroys both transistors.

Thermal runaway may be prevented by the inclusion of another resistor in each emitter lead of a complementary common collector audio output stage. However, since the load current must flow through these resistors, a power loss is incurred and the resistors must therefore be made as small as possible. It is also common practice to use diodes or thermisters in the voltage divider to obtain some degree of compensation for the base-emitter voltage temperature coefficient, but the lack of a good thermal connection between the compensating element and the junction to be compensated at least partly defeats this tactic. The circuits have been rearranged in an almost endless number of ways, including transformer coupling, pseudo-complementary (both transistors the same type), and conventional push-pull without in any way alleviating the above-described difficulties.

The present invention provides a Class B transistor amplifier of relatively simplified construction which avoids these difficulties. The circuit of the present invention includes an emitter follower which opertaes satisfactorily for the negative half cycle of the input and the first part of the positive half cycle. Also incorporated in the circuit are a pair of supply transistors which are arranged to supply a sufficient amount of current to the emitter-follower to prevent cutoff during the entire positive half cycle. As a result, the full cycle of the input signal passes through the emitter-follower and is reproduced at its output.

It is therefore one object of the present invention to provide an improved Class B amplifier output stage.

Another object of the present invention is to provide an improved Class B transistor power amplifier.

Another object of the present invention is to provide a novel audio amplifier incorporating a power transistor as its output stage.

Another object of the present invention is to provide an improved emitter-follower amplifier having little crossover distortion, good efficiency and good thermal stability.

Another object of the present invention is to provide an emitter-follower power amplifier capable of reproducing positive as well as negative half cycles of an input signal.

Another object of the present invention is to provide an emitter-follower amplifier incorporating a supply circuit which prevents the emitter-follower from cutting off over a complete full cycle of the input signal.

Figure 2:
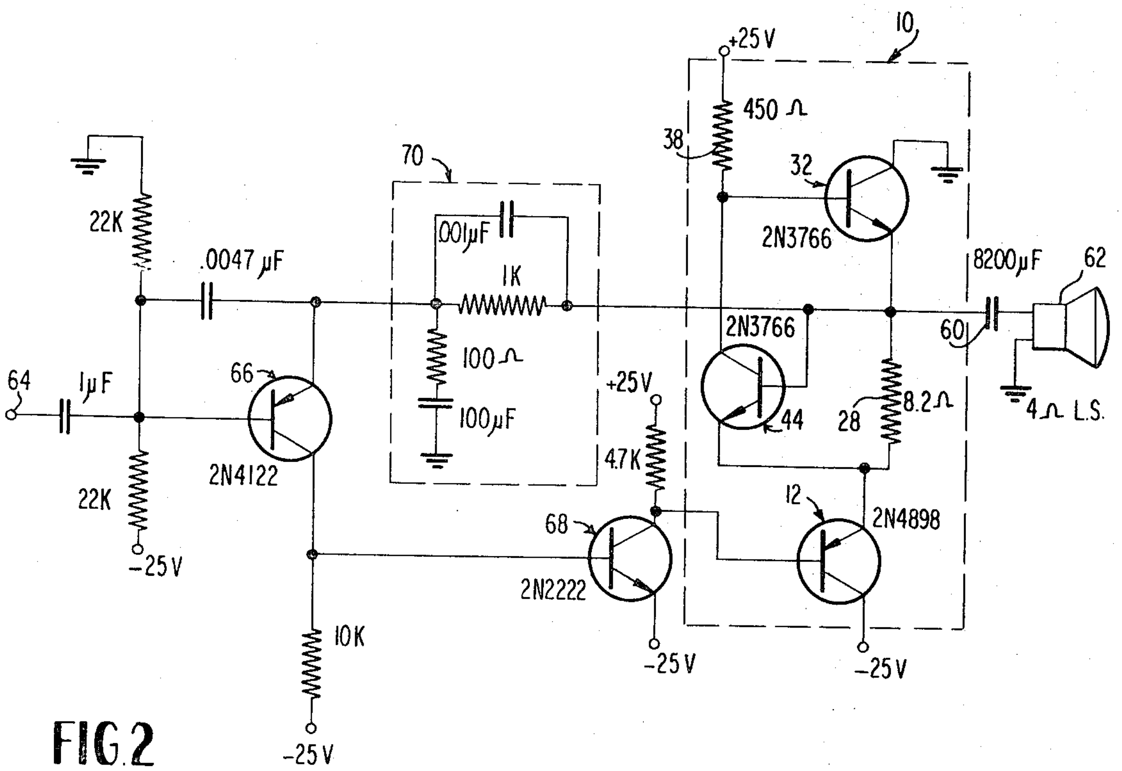

These and further objects and advantages of the invention will be more apparent upon reference to the following specification, claims and appended drawings, wherein:

FIG. 1 is a circuit diagram of the novel Class B transistor power amplifier of the present invention; and FIG. 2 is a detailed circuit diagram with component values showing an 8 watt phonograph amplifier incorporating the novel Class B output stage of this invention.

Referring to the drawings, the novel Class B amplifier of the present invention is generally indicated at 10 in FIG. 1 and comprises a transistor 12 labeled $Q_1$ connected as an emitter-follower. Transistor 12 is a conventional silicon PNP junction transistor and comprises a base 14, emitter 16, and collector 18. Base 14 is connected to a suitable audio signal input source 20, the other side of which is connected to ground as indicated at 22. The opposite sides of source 20 form input terminals 21 and 23 for the amplifier. Collector 18 is connected to a source of negative potential such as the battery 24, the positive side of which is grounded at 26.

Emitter 16 is connected through a bias resistor 28 labeled $R_2$ to the emitter 30 of a second transistor 32 labeled $Q_2$. Transistor 32 is a conventional silicon NPN junction transistor and in addition to emitter 30 includes a base 34 and collector 36. A second bias resistor 38 labeled $R_1$ connects the base of transistor 32 to a source of positive potential such as battery 40, the negative side of which is connected to ground 26. Batteries 24 and 40 are shown separately but may form a common power supply for the amplifier with its midjoint grounded at 26.

Base 34 of transistor 32 is also connected to the collector 42 of a third transistor 44 labeled $Q_3$. Again, transistor 44 is a conventional silicon NPN junction transistor including base 46 and emitter 48. The upper end of resistor 28 is connected to the base of transistor 44 by lead 50 and the emitters of transistors 12 and 44 are connected together by lead 52. The collector of transistor 32 is connected to the positive power supply 40 by lead 54. Finally, the base of transistor 44 is connected to ground through a load resistor 56 labeled $R_L$. The opposite sides of the load resistor are connected to the amplifier output terminals 53 and 55.

In operation, the emitter-follower transistor 12 operates satisfactorily for the negative half cycle of the input from signal source 20 and the first part of the positive half cycle. In a conventional circuit, when the output current equals that in the supply resistor, no further positive excursion could occur and the emitter-follower transistor 12 would cut off, resulting in a clipped positive half cycle at the output. The purpose of the additional transistors 32 and 44 and the associated resistors 28 and 38 is to supply whatever amount of current is necessary to prevent cutoff of transistor 12 so that the full cycle of the input from source 20 is transmitted through load resistor 56.

Specifically, for negative excursions of the input, the emitter-follower transistor 12 behaves in a conventional manner except that the load current through load resistor 56 also flows through the base-emitter junction of transistor 44 turning transistor 44 on. This current is labeled *i* neg in FIG. 1. A small loss of efficiency is caused by the 0.6 volt required to saturate this junction. Since transistor 44 is turned on, transistor 32 is turned off and the only current taken from the positive supply source 40 is that current flowing in resistor 38.

As the signal input voltage from source 20 rises through zero, the load current decreases until most of it flows through resistor 28 instead of into the base of transistor 44. At this time transistor 44 begins to turn off, causing the current flowing in resistor 38 to switch from the collector 42 of transistor 44 to the base 34 of transistor 32, bringing transistor 32 into conduction. As the input voltage rises (goes more positive), transistor 32 comes into heavier conduction, supplying the load current through load resistor 56 from the positive battery 40. This current is labeled *i* pos in FIG. 1. At this point, emitter-follower transistor 12 is conducting just sufficiently to maintain the 0.6 volt drop across resistor 28 required to maintain transistor 44 in mild conduction. Emitter-follower transistor 12 remains in this slightly conducting state for the entire positive half cycle from the input signal source 20. The circuit therefore functions as described to supply whatever current is needed from the positive supply source 40 to prevent cutoff of the emitter-follower transistor 12.

In practice, it may be desirable to return resistor 38 to a higher positive supply voltage or to bootstrap it since it supplies the base current for transistor 32 which is at a maximum when the voltage across resistor 38 is a minimum. This is a feature of almost all emitter-follower output stages and the usual solutions are satisfactory.

FIG. 2 is a circuit diagram of an audio amplifier incorporating the Class B power stage of FIG. 1. The output stage is indicated by the dashed box 10 in FIG. 2 and is in every respect identical to the circuit illustrated in FIG. 1. The power amplifier 10 is connected through a coupling capacitor 60 to a speaker 62. The audio input is connected between ground and an input terminal 64 and is fed through a pair of transistors 66 and 68 to the base of emitter-follower transistor 12 forming a part of the power amplifier stage 10. Transistor 68 provides additional gain for the overall circuit and the connection to transistor 66 through the RC networks indicated by the dashed box 70 provides some negative feedback for the circuit. The overall circuit of FIG. 2 represents a complete phonograph amplifier capable of delivering 8 watts RMS to a 4 ohm load in the form of loudspeaker 62.

It is apparent from the above that the present invention provides an improved transistor Class B output stage and an overall audio amplifier incorporating an improved power amplifier. Important features of the invention include the provision of an emitter-follower incorporating a supply circuit which supplies to the emitter-follower whatever amount of current is necessary to prevent it from cutting off, particularly during the positive portions of the signal input voltage. This is accomplished in a simplified three-transistor configuration employing conventional junction transistors and evidences the advantages of simplicity, minimum crossover distortion, high efficiency, and good thermal stability. In particular, crossover distortion is minimized without sacrificing significantly the efficiency of operation and at the same time insuring against thermal runaway.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed and desired to be secured by United States Letters Patent is:

1. A Class B transistor amplifier comprising a pair of input and a pair of output terminals, an emitter-follower transistor coupled between said input and output terminals, a second transistor coupled across said output terminals for supplying a current to said output terminals during excursions of an input signal to said input terminals tending to cut off said emitter follower transistor, and means including a third transistor and bias resistor coupled to said emitter-follower transistor for maintaining said emitter-follower transistor in light conduction during said excursions of said input signal.

2. An amplifier according to claim 1 wherein said emitter-follower transistor comprises a transistor having an approximately 0.6 volt contact potential.

3. An amplifier according to claim 2 wherein said emitter-follower transistor is a silicon junction transistor.

4. A Class B transistor amplifier comprising first and second transistors having their emitter-collector circuits connected in series, a power supply connected across said transistors, a pair of load impedance terminals connected between an intermediate point on said power supply and a point intermediate the emitter-collector circuits of said transistors, a bias resistor connecting the load impedance terminal remote from said power supply to the emitter-collector circuit of said first transistor, an input terminal coupled to the base of said first transistor, and a third transistor having its base connected to said load impedance terminal remote from said power supply, the emitter-collector circuit of said third transistor being connected from the base of said second transistor to the end of said bias resistor connected to said first transistor.

5. A Class B transistor amplifier comprising first, second and third transistors, a power supply connected to the collectors of said first and second transistors, a load impedance connected from an intermediate point on said power supply to the emitter of said second transistor, a bias resistor connecting the emitters of said first and second transistors, a signal source connected between the base of said first transistor and said intermediate point on said power supply, the base of said third transistor being connected to the emitter of said second transistor, means connecting the base of said second transistor to the collector of said third transistor, means connecting the emitters of said first and third transistors, and a second resistor connecting the base and collector of said second transistor.

6. A Class B transistor amplifier comprising first and second transistors having their emitter-collector circuits connected in series, a power supply connected across said transistors, a pair of load impedance terminals connected between an intermediate point on said power supply and point intermediate the emitter-collector circuits of said transistors, a bias resistor connecting the load impedance terminal remote from said power supply to the emitter-collector circuit of said first transistor, an input terminal coupled to the base of said first transistor, and a third transistor having its base connected to said load impedance terminal remote from said power supply, the emitter-collector circuit of said third transistor being connected from the base of said second transistor to the end of said bias resistor connected to said first transistor, said first and second transistors comprising complementary common collector transistors.

7. An amplifier according to claim 6 wherein said bias resistor connects the emitters of said first and second transistors.

References Cited

UNITED STATES PATENTS

| | | | |
|---|---|---|---|
| 3,086,177 | 4/1963 | Beers et al. | 330—18 |
| 3,163,827 | 12/1964 | Kandiah | 330—18 X |
| 3,437,945 | 4/1969 | Duncan | 330—17 X |
| 3,440,551 | 4/1969 | Narud et al. | 330—17 X |

ROY LAKE, Primary Examiner

J. B. MULLINS, Assistant Examiner

U.S. Cl. X.R.

330—15, 17, 18, 22, 28, 40

PO-1050
(5/69)

UNITED STATES PATENT OFFICE
CERTIFICATE OF CORRECTION

Patent No. 3,543,173 Dated November 24, 1970

Inventor(s) McKENNY W. EGERTON, JR.

It is certified that error appears in the above-identified patent and that said Letters Patent are hereby corrected as shown below:

Column 2, line 11, "opertaes" should read -- operates --; line 70, "midjoint" should read -- midpoint --. Column 5, line 6, before "point" insert -- a --.

Signed and sealed this 28th day of September 1971.

(SEAL)
Attest:

EDWARD M.FLETCHER,JR.
Attesting Officer

ROBERT GOTTSCHALK
Acting Commissioner of Paten